United States Patent
Lee et al.

(10) Patent No.: US 9,577,022 B2
(45) Date of Patent: Feb. 21, 2017

(54) INDUCTOR

(71) Applicant: SAMSUNG ELECTRONICS CO., LTD., Suwon-si (KR)

(72) Inventors: Jae Sup Lee, Yongin-si (KR); Seong Joong Kim, Suwon-si (KR)

(73) Assignee: Samsung Electronics Co., LTD., Suwon-si (KR)

( * ) Notice: Subject to any disclaimer, the term of this patent is extended or adjusted under 35 U.S.C. 154(b) by 0 days.

(21) Appl. No.: 13/746,366

(22) Filed: Jan. 22, 2013

(65) Prior Publication Data

US 2013/0299941 A1 Nov. 14, 2013

(30) Foreign Application Priority Data

May 9, 2012 (KR) .................. 10-2012-0049124

(51) Int. Cl.
*H01L 27/08* (2006.01)
*H01L 49/02* (2006.01)
*H01L 23/64* (2006.01)
*H01L 23/00* (2006.01)
*H01F 17/00* (2006.01)
*H01L 23/66* (2006.01)
*H01F 27/28* (2006.01)

(52) U.S. Cl.
CPC ........... *H01L 28/10* (2013.01); *H01F 17/0006* (2013.01); *H01L 23/645* (2013.01); *H01L 23/66* (2013.01); *H01L 24/06* (2013.01); *H01L 24/49* (2013.01); *H01F 2027/2814* (2013.01); *H01L 2223/6611* (2013.01); *H01L 2224/05553* (2013.01); *H01L 2224/05554* (2013.01); *H01L 2224/451* (2013.01); *H01L 2224/4813* (2013.01); *H01L 2224/48091* (2013.01); *H01L 2224/4903* (2013.01); *H01L 2224/49113* (2013.01); *H01L 2924/00014* (2013.01); *H01L 2924/10253* (2013.01); *H01L 2924/3011* (2013.01); *H01L 2924/3025* (2013.01); *H01L 2924/30107* (2013.01); *H01L 2924/30111* (2013.01)

(58) Field of Classification Search
CPC ........ H01L 23/645; H01L 23/66; H01L 24/49; H01L 2924/30107; H01L 2224/4903; H01L 2224/4813; H01L 2224/49113; H01L 2224/49175
USPC .................................................. 257/531, 666
See application file for complete search history.

(56) References Cited

U.S. PATENT DOCUMENTS

| | | | |
|---|---|---|---|
| 6,046,901 A * | 4/2000 | Davis et al. ............... | 361/303 |
| 6,323,735 B1 | 11/2001 | Welland et al. | |
| 6,424,263 B1 * | 7/2002 | Lee et al. .................. | 340/572.7 |
| 6,621,140 B1 | 9/2003 | Gibson et al. | |
| 6,775,901 B1 * | 8/2004 | Lee et al. .................. | 29/602.1 |
| 7,304,393 B1 * | 12/2007 | Greene ...................... | 257/784 |

(Continued)

FOREIGN PATENT DOCUMENTS

| JP | 2006-024856 | 1/2006 |
|---|---|---|
| KR | 10-0660873 | 12/2006 |

*Primary Examiner* — A. Sefer
(74) *Attorney, Agent, or Firm* — NSIP Law (57) ABSTRACT

An inductor is provided. The inductor includes first and second bonding pads on a semiconductor substrate, a lead pin on a board trace, a first bonding wire being configured to connect the first bonding pad and the lead pin, and a second bonding wire configured to connect the second bonding pad and the lead pin, the second bonding wire being connected to the first bonding wire in parallel.

19 Claims, 10 Drawing Sheets

(56) References Cited

U.S. PATENT DOCUMENTS

| | | |
|---|---|---|
| 7,453,142 B2 | 11/2008 | Lee et al. |
| 7,768,097 B2 | 8/2010 | Koo et al. |
| 2005/0045986 A1* | 3/2005 | Koo et al. .................... 257/531 |
| 2005/0242897 A1* | 11/2005 | Lim et al. .................... 331/179 |
| 2009/0096068 A1* | 4/2009 | Sjoestroem ................. 257/666 |
| 2009/0201115 A1 | 8/2009 | Ghoshal et al. |
| 2013/0242518 A1* | 9/2013 | Wu ............................. 361/767 |
| 2013/0285239 A1* | 10/2013 | Wu ............................. 257/738 |

\* cited by examiner

FIG. 1

Board Trace

INDUCTOR

CROSS-REFERENCE TO RELATED APPLICATIONS

This application claims the benefit under 35 U.S.C. §119 (a) of Korean Patent Application No. 10-2012-0049124, filed on May 9, 2012, in the Korean Intellectual Property Office, the entire disclosure of which is incorporated herein by reference for all purposes.

BACKGROUND

1. Field

The following description relates to an inductor.

2. Description of Related Art

The wireless communication field has experienced rapid development of a variety of devices, such as mobile phones, wireless pagers, and devices utilizing satellite communication. As a result, due to the increased in demand caused by the rapid development, integrated circuits (ICs) such as monolithic microwave integrated circuits (MMICs) have become important. In an MMIC, a radio frequency (RF) circuit includes a passive element and an active element on a single semiconductor substrate. Accordingly, MMICs are able to be mass produced for various small and light wireless communication devices at a minimal cost.

Silicon is generally used in the fabrication of ICs. Due to a poor insulating characteristics and losses occurring through conductivity of a silicon substrate, passive elements may experiences losses. In the case of an inductor that is a passive element, a high substrate loss may occur due to low resistance of a silicon substrate, thereby possibly leading to signal attenuation.

In an example, an inductor characteristic is indicated as a quality factor Q. Q denotes a ratio of energy accumulated in a reactive element such as a capacitor or an inductor with respect to a sum of energy loss. An idealistic tuning circuit may include an inductor and a capacitor, and may accumulate energy by exchanging current from a single element to a subsequent element. Accordingly, an inductor having a good Q value may promote operational characteristics in an IC.

Even though an inductor is used to configure a frequency chip, in an example, the inductor occupies the largest area of the frequency chip as a single element and is affected by a high frequency characteristic resulting from a parasitic capacitance and a resistance component from a neighboring material, a structure, and an internal material. In this case, it may be beneficial to configure an inductor having a high Q, or a high inductance.

Accordingly, to enhance a Q of an inductor, various methods known to one of ordinary skill in the art have been employed, such as a method of decreasing a serial resistance of a metal line using a metal having a low specific resistance, a multilayered metal, a thick metal, and other suitable metals known to one of ordinary skill in the art, or a method of decreasing a substrate loss using pattern ground shielding.

The above methods may have some constraints. For example, different from a general metal wiring, an inductor is formed in an upper portion of an upper metal wiring and does not leave room for another element to be integrated in a lower portion of the upper metal wiring.

Further, in general, to form an inductor within an IC package, a package substrate may include bonding pads that are separate from input/output package pins. To receive the bonding pads, a size of an IC substrate needs to increase, thereby sacrificing integration.

SUMMARY

In a general aspect, an inductor includes first and second bonding pads on a semiconductor substrate, a lead pin on a board trace, a first bonding wire being configured to connect the first bonding pad and the lead pin, and a second bonding wire configured to connect the second bonding pad and the lead pin, the second bonding wire being connected to the first bonding wire in parallel.

The inductor may further include that the first bonding wire, the second bonding wire, the lead pin, and the board trace are configured to form a closed loop and maximize a flux linkage that passes the closed loop.

The inductor may further include an arm configured by the first bonding wire and the second bonding wire to include a non-horizontal structure to minimize a flux coupling formed between an other arm, the arm including the first bonding wire and the second bonding wire.

The inductor may further include an arm configured by the first bonding wire and the second bonding wire to include a vertical structure or a structure similar thereto to minimize a flux coupling formed between an other arm, the arm including the first bonding wire and the second bonding wire.

The inductor may further include that an inductance of the inductor is determined based on a combination of inductances of a length of the first bonding wire, a length of the second bonding wire, a length of the lead pin, and a length of the board trace.

The inductor may further include that the first and second bonding pads overlap each other or are connected to each other.

The inductor may further include that the first and second bonding pads are in parallel with each other, in series, or in a zigzagged form.

The inductor may further include that the board trace is configured as a single portion or includes a shredded parallel structure that is divided into at least two portions.

The inductor may further include that the first and second bonding wires have different heights.

In another general aspect, an inductor includes bonding pads on a semiconductor substrate, the bonding pads including a first bonding pad and a second bonding pad, lead pins on a board trace, the lead pins including a predetermined lead pin, and bonding wires configured to connect the bonding pads and the lead pins, the bonding wires comprising a first bonding wire and a second bonding wire, the first bonding wire being configured to connect the first bonding pad and the predetermined lead pin, the second bonding wire being configured to connect the second bonding pad and the predetermined lead pin, the second bonding wire being connected to the first bonding wire in parallel.

The inductor may further include that a single one of the bonding pads is connected to a single one of the bonding wires.

The inductor may further include that the bonding wires, the lead pins, and the board trace are configured to form a closed loop and maximize a flux linkage that passes the closed loop.

The inductor may further include that arms configured by the bonding wires have a non-horizontal structure to minimize a flux coupling formed between the arms.

The inductor may further include that arms configured by the bonding wires have a vertical structure or a structure similar thereto to minimize a flux coupling formed between the arms.

The inductor may further include that an inductance is determined based on a combination of inductances formed by the bonding wires, the lead pins, and the board trace.

The inductor may further include that the bonding pads overlap each other or are connected to each other on the semiconductor substrate.

The inductor may further include that the bonding pads are in parallel with each other, in series, or in a zigzagged form on the semiconductor substrate.

The inductor may further include that the board trace is a single portion or has a shredded parallel structure that is divided into at least two portions.

The inductor may further include that a first one of the lead pins and a second one of the lead pins spaced apart from the first lead pin are connected to each other through the board trace that has the shredded parallel structure.

The inductor may further include that the bonding wires connected to the predetermined lead pin have different heights.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, description of well-known functions and constructions may be omitted for increased clarity and conciseness.

Figure 1:
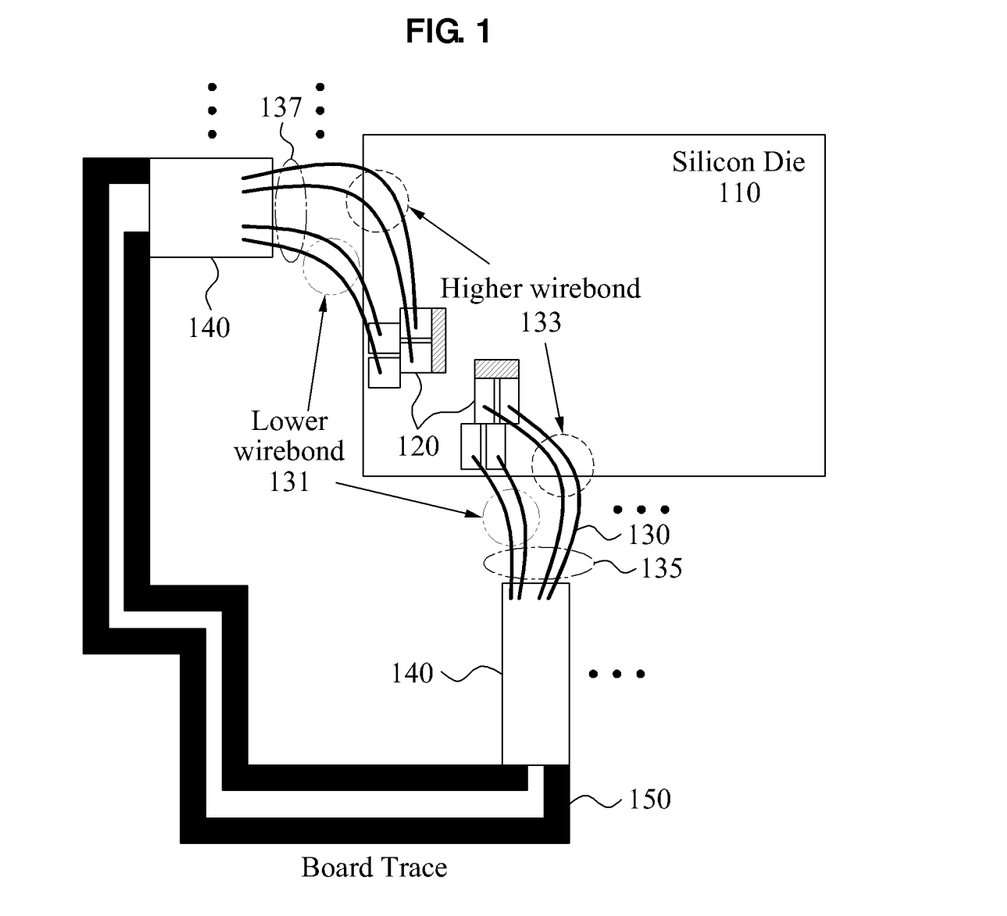
FIG. 1 is a diagram illustrating an example of a structure of an inductor of an integrated circuit (IC).

FIG. 1 is a diagram illustrating an example of a structure of an inductor of an integrated circuit (IC). Referring to the example illustrated in FIG. 1, the inductor includes bonding pads 120, bonding wires 130, and lead pins 140 disposed on a board trace 150.

The bonding pads 120 are attached on a semiconductor substrate 110. The semiconductor substrate 110 includes a silicon die. In another example, a size of each of the bonding pads 120 is manufactured to be relatively small compared to a general bonding pad, so that a single bonding wire is connected to a single bonding pad. In this example, the bonding pads 120 overlap each other, or are connected to each other on the semiconductor substrate 110.

The bonding wires 130 connect the bonding pads 120 and the lead pins 140. Accordingly, in an example, the semiconductor substrate 110, the plurality of bonding pads 120, the plurality of bonding wires 130, the plurality of lead pins 140, and the board trace 150 form a closed loop. In an additional example, the bonding pads 120, the bonding wires 130, the lead pins 140, and the board trace 150 that form the closed loop are disposed to maximize a flux linkage. In a further example, an area of the closed loop is maximized by appropriately disposing the bonding pads 120 at positions including corners of the semiconductor substrate 110.

Further, a first bonding wire to connect a first bonding pad and a predetermined lead pin and a second bonding wire to connect a second bonding pad and the predetermined lead pin are connected to each other in parallel. In an example, the bonding wires 130, the lead pins 140, and the board trace 150 include a metal having a low resistance R.

Among the bonding wires 130, in a general aspect, bonding wires connected to a predetermined lead pin have different heights. In the example illustrated in FIG. 1, a portion of bonding wires, higher wirebond 133, are connected to a predetermined lead pin 140 at a height that is greater than a height at which another portion of the bonding wires, lower wirebond 131, is connected to the predetermined lead pin 140. In an additional example, the bonding wires of the portions of bonding wires are connected to the predetermined lead pin having sequentially increasing or decreasing heights.

In an example, to minimize a flux coupling formed between arms of the inductor configured by the bonding wires 130, the arms of the inductors have a non-horizontal structure. An "arm of an inductor" refers to the bonding wires 130 configured to connect the bonding pads 120 attached on the semiconductor substrate 110 and the lead pins 140 disposed on the board trace 150. In the example illustrated in FIG. 1, the arms of the inductor include first arms 135 and second arms 137 that are separately disposed at positions that include corners of the semiconductor substrate 110. In an additional example, angles between the first arm 135 and the second arms 137 are configured to have a vertical structure or a structure similar thereto excluding a horizontal structure, thereby serving to maximize inductance and a quality factor (Q) of the inductor through minimizing flux coupling between the bonding wires 130.

A Q of the inductor may be expressed by Equation 1:

$$Q = \omega * L / R \qquad \text{[Equation 1]}$$

In Equation 1, ω denotes a resonant frequency, L denotes an inductance, and R denotes total resistance, such as, for example, metal and substrate resistance. In an example tuning circuit, energy is lost due to resistance. Accordingly, in a further example, a high Q is obtained by decreasing resistance R or increasing inductance L.

To obtain a high Q value, a first bonding wire and a second bonding wire may be connected to each other in parallel. When bonding wires are connected to each other in parallel, resistances R of the bonding wires may decrease. Loss due to resistance R may be further decreased by configuring the bonding wires 130, the lead pins 140, and the board trace 150 using a metal have low resistance R.

Inductance L may be expressed by Equation 2:

$$L = \Phi/I \qquad \text{[Equation 2]}$$

In Equation 2, Φ denotes a flux linkage and I denotes unit current.

In an example, by disposing bonding wires, lead pins, and a board trace to form a large area, a flux linkage that passes through a closed loop is maximized. In another example, arms of an inductor are configured to have a vertical structure or a structure similar thereto excluding a horizontal structure, thereby serving to minimize a flux coupling and maximize a flux linkage. In a further example, an inductance of an inductor may be determined based on a combination of inductances formed by a length of each of the bonding wires, the lead pins, and the board trace, an area of a closed loop, and a parallel level thereof. The Q of an inductor may be increased by adjusting the inductance of the inductor based on the various lengths, the area of the closed loop, and the parallel level as described above, it is possible to change the inductance value of the inductor.

In a general aspect, the board trace is configured as a single portion or has a shredded parallel structure that is divided into at least two portions. In an example, when the respective bonding wires are connected to each other in parallel by connecting a single bonding pad and a single bonding wire, skin effect occurs on the board trace by increasing a frequency.

The skin effect describes a situation in which direct current passes a wire and current flows at the same current density in a cross-sectional area of a conductor, but a current density increases in an outer portion, for example, a skin portion, of the wire in alternating current (AC) with a frequency. In an example, the skin effect occurs if the inductance increases due to an increasing flux linkage within the cross-sectional area of the wire, thereby causing current not to flow well in a center portion of the wire, but flow instead on the surface of the wire. Accordingly, by configuring the board trace to have a shredded parallel structure, or a multi-parallel structure in which the board trace is divided into at least two portions, resistance R by the board trace may be decreased and the skin effect may be minimized.

A first lead pin and a second lead pin spaced apart from the first lead pin may be connected to each other through the board trace that has the shredded parallel structure.

Figure 2:
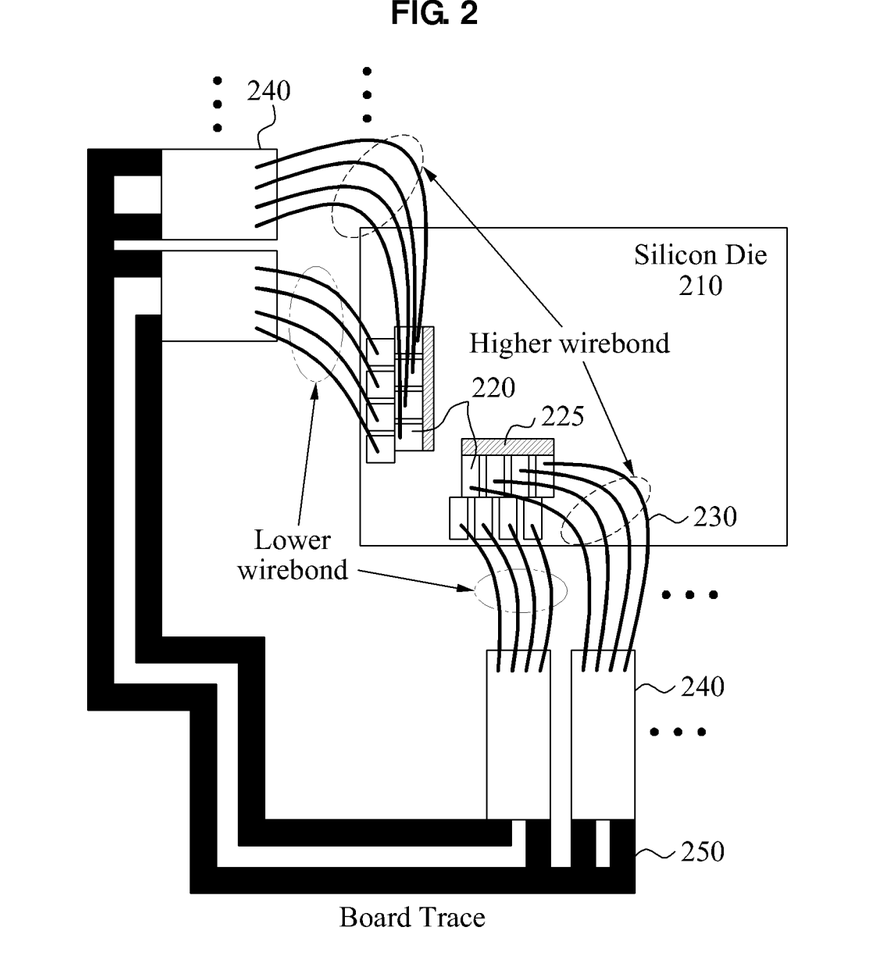
FIG. 2 is a diagram illustrating another example of a structure of an inductor of an IC.

FIG. 2 is a diagram illustrating another example of a structure of an inductor of an IC. Referring to the example illustrated in FIG. 2, the inductor for the integrated circuit includes bonding pads 220, bonding wires 230, and lead pins 240 disposed on a board trace 250. Similar to the example illustrated in FIG. 1, the bonding wires 220 are attached on a semiconductor substrate 210. The semiconductor substrate 210 includes a silicon die. The bonding wires 230 connect the bonding pads 220 and the lead pins 240. Accordingly, in an example, the semiconductor substrate 210, the bonding pads 220, the bonding wires 230, the lead pins 240, and the board trace 250 form a closed loop. In an additional example, the bonding pads 220, the bonding wires 230, the lead pins 240, and the board trace 250 that form the closed loop are disposed to maximize a flux linkage. In a further example, an area of the closed loop is maximized by appropriately disposing the bonding pads 220 at positions that include corners of the semiconductor substrate 210.

Further, a first bonding wire to connect a first bonding pad and a predetermined lead pin and a second bonding wire to connect a second bonding pad and the predetermined lead pin are connected to each other in parallel. In an example, the bonding wires 230, the lead pins 240, and the board trace 250 include a metal having a low resistance R. Among the bonding wires 230, in a general aspect, the bonding wires connected to a predetermined lead pin have different heights. In an example, the bonding pads 220 overlap each other on the semiconductor substrate 210, or are connected to each other by a metal wire or a conductor 225. In another example, the bonding pads 220 are disposed to be in parallel with each other, in series, or in a zigzagged form of the example illustrated in FIG. 1 on the semiconductor substrate 210.

Figure 3:
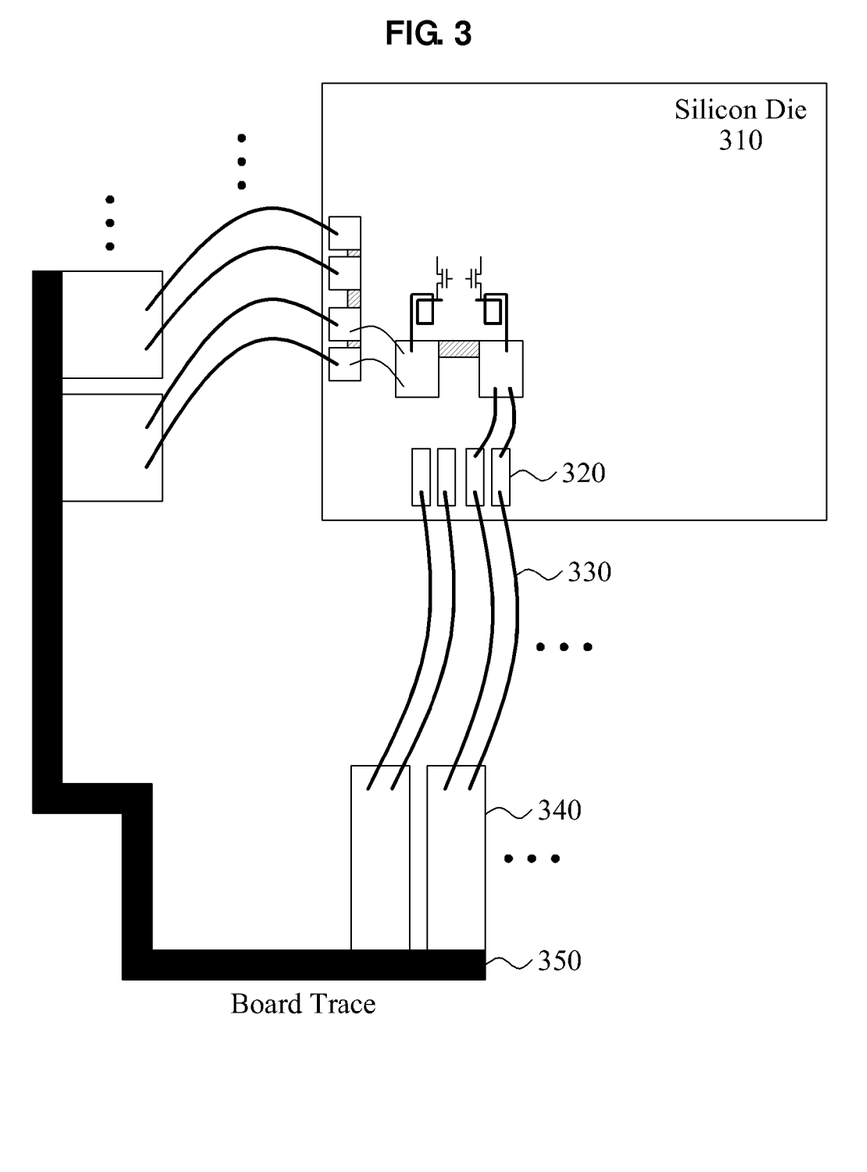
FIG. 3 is a diagram illustrating still another example of a structure of an inductor of an IC.

FIG. 3 is a diagram illustrating still another example of a structure of an inductor of an IC. Referring to the example illustrated in FIG. 3, the inductor for the IC includes bonding pads 320, bonding wires 330, and lead pins 340 disposed on a board trace 350. Similar to the example illustrated in FIG. 1, the bonding wires 320 are attached on a semiconductor substrate 310. The semiconductor substrate 310 includes a silicon die. The bonding wires 330 connect the bonding pads 320 and the lead pins 340. Accordingly, in an example, the semiconductor substrate 310, the bonding pads 320, the bonding wires 330, the lead pins 340, and the board trace 350 form a closed loop, and are disposed to maximize a flux linkage. In further example, an area of the closed loop is maximized by appropriately disposing the bonding pads 320 at positions that include corners of the semiconductor substrate 310.

Further, a first bonding wire to connect a first bonding pad and a predetermined lead pin and a second bonding wire to connect a second bonding pad and the predetermined lead pin are connected to each other in parallel. Among the bonding wires 330, in a general aspect, bonding wires connected to a predetermined lead pin have different heights. In the example illustrated in FIG. 3, the board trace 350 is configured as a single board trace.

In an example, an inductance of the inductor is determined based on a combination of inductances formed by the bonding wires 330, the lead pins 340, and the board trace 350. Accordingly, by adjusting the inductance based on the bonding wires 330, the plurality of lead pins 340, and the board trace 350, it is possible to change the inductance value of the inductor and positively affect the Q of the inductor.

Figure 4:
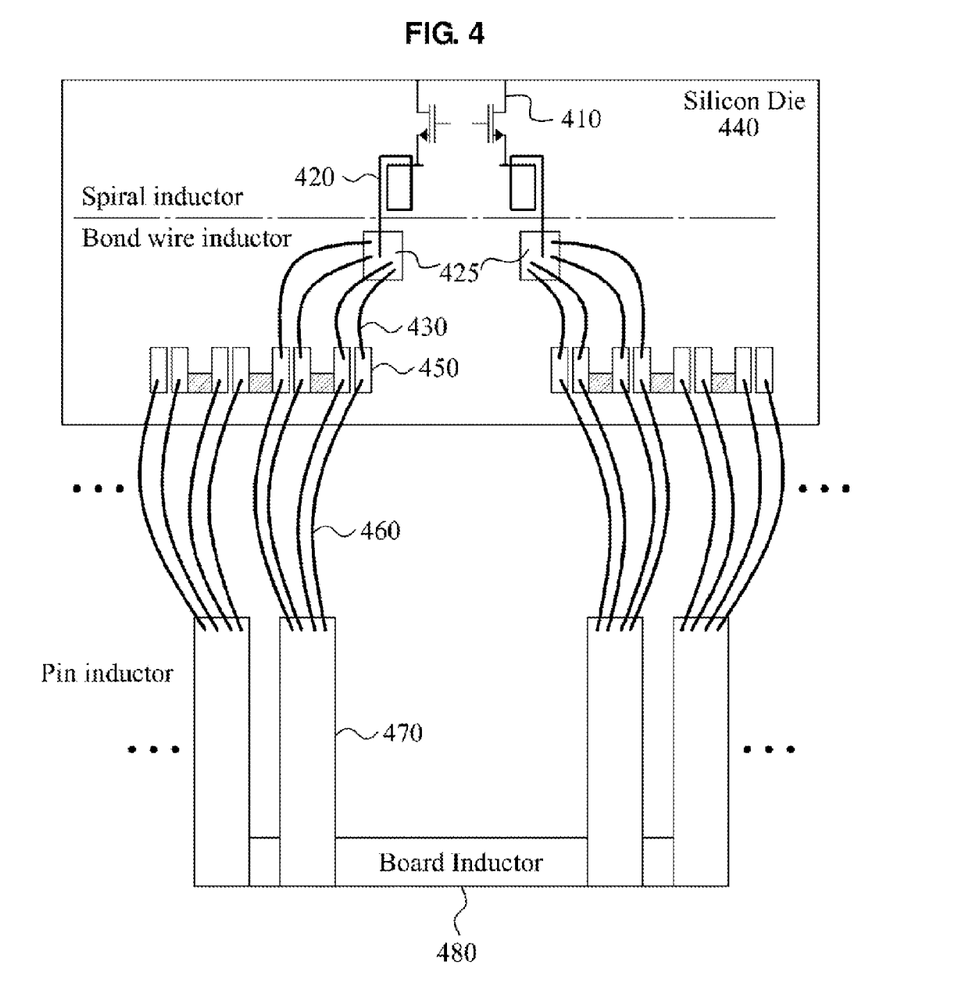
FIG. 4 is a diagram illustrating an example of an inductor of an IC having a high quality factor (Q) due to a parallel structure and a structure of arms of the inductor.

FIG. 4 is a diagram illustrating an example of an inductor of an IC having a high Q due to a parallel structure and a structure of arms of the inductor. Referring to the example illustrated in FIG. 4, voltage supplied from a voltage controlled oscillator (VCO) 410 is supplied to a semiconductor substrate 440 through a spiral inductor 420. Here, the spiral inductor 420 and the semiconductor substrate 440 are connected to bonding wires 430 through a bonding pad 425. The bonding wires 430 are connected to each other in parallel. The semiconductor substrate 440 includes a silicon die.

The bonding pads 450 are attached on the semiconductor substrate 440, and lead pins 470 are disposed on a board trace 480. The bonding pads 450 and the lead pins 470 are connected to each other through bonding wires 460. The bonding wires 460 are also be connected to each other in parallel. The lead pins 470 are also positioned to be in parallel with each other. As described above, the bonding wires 430 and 460, and the lead pins 470 that are connected to each other in parallel may positively impact a Q value by decreasing a resistance R value.

In an example, voltage supplied from the VCO 410 is supplied to the semiconductor substrate 440 through the spiral inductor 420, the bonding pad 425, and the bonding wires 430. In another example, voltage supplied to the semiconductor substrate 440 is supplied to the bonding wires 460 connected to the bonding pads 450, the lead pins 470 connected to the bonding wires 460, and the board trace 480 on which the lead pins 470 are positioned. Through the above process, a closed loop is formed between the VCO 410 and the board trace 480.

In an example, by disposing the bonding wires 460 that form the closed loop including corners of the semiconductor substrate 440, arms of the inductor are configured to have a vertical structure or a structure similar thereto excluding a horizontal structure. When the arms of the inductor are configured to have the vertical structure or the structure similar thereto, an area of the closed loop may be maximized. When the area of the closed loop is maximized, a flux linkage that passes through the closed loop may be maximized and a Q value of the inductor may be positively impacted.

Figure 5:
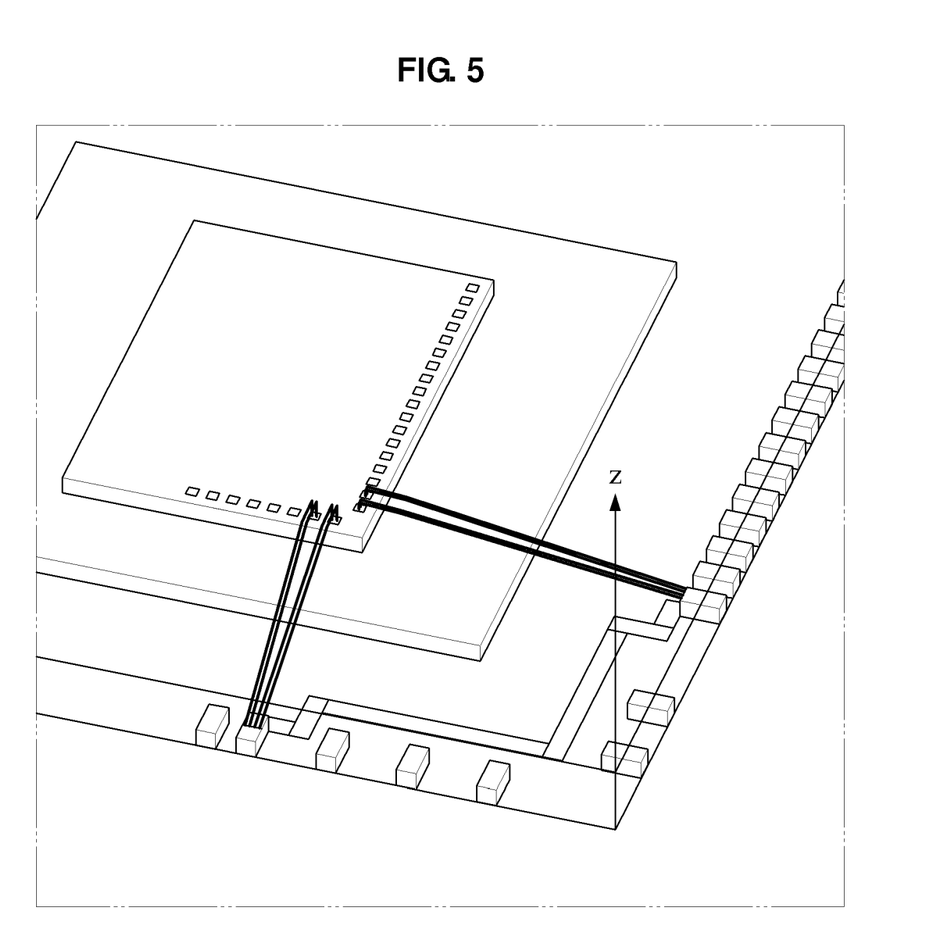
FIG. 5 is a diagram illustrating an example of an inductor of an IC that is formed on an IC package using a quad-flat no-lead (QFN) package scheme.
Figure 6:
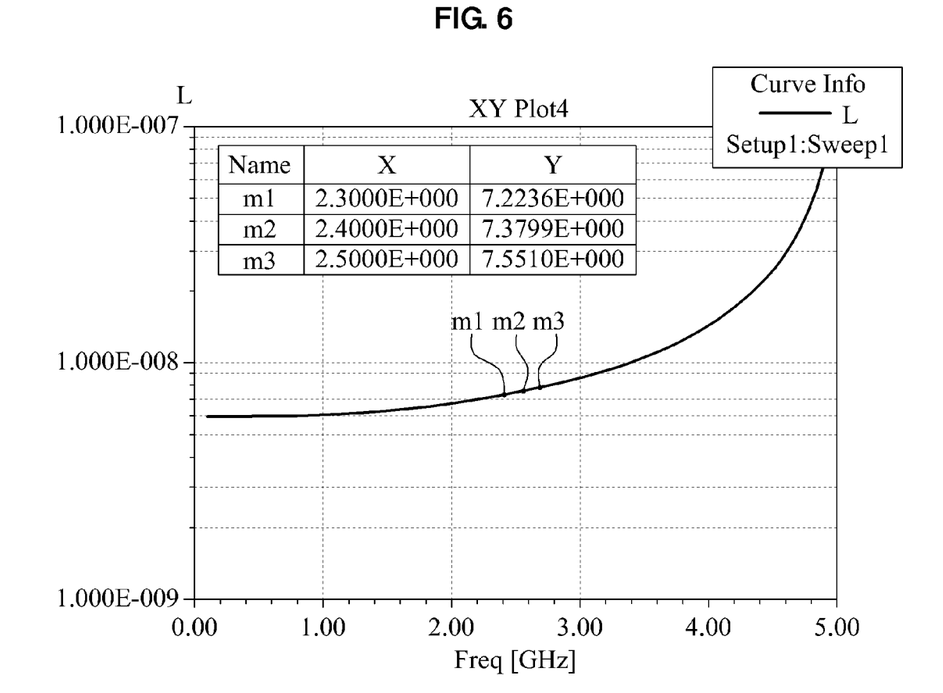
FIG. 6 is a graph illustrating an example of an inductance based on a structure of FIG. 5.
Figure 7:
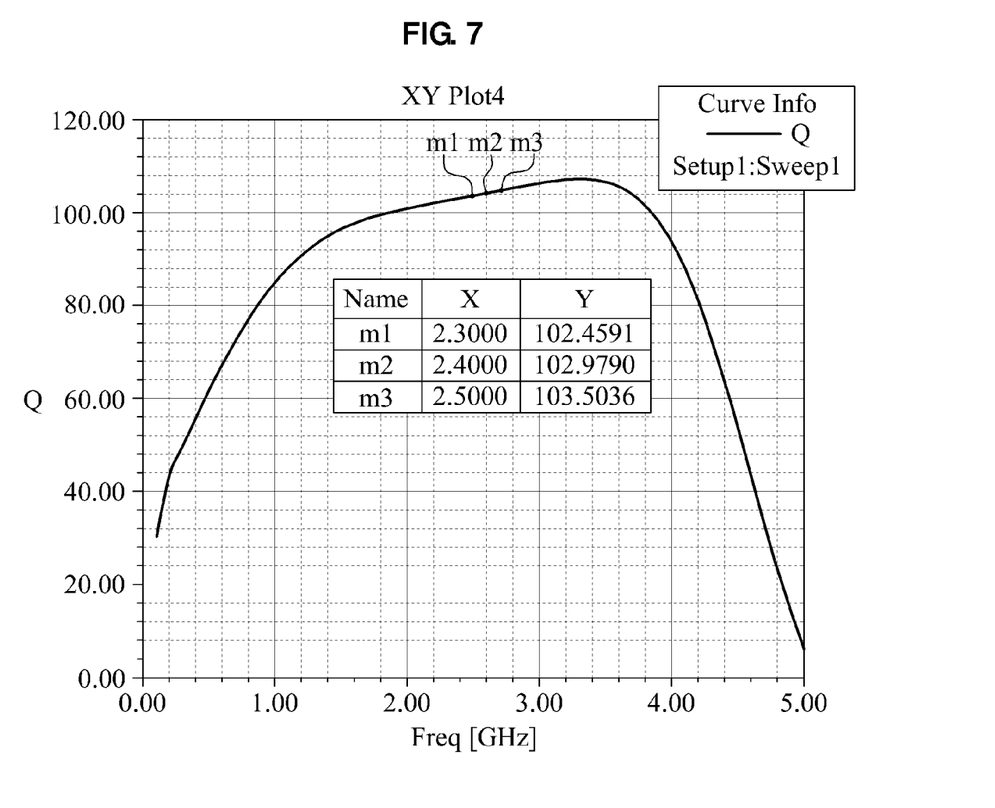
FIG. 7 is a graph illustrating a Q of an inductor that is obtained based on the inductance of FIG. 6.

FIG. 5 is a diagram illustrating an example of an inductor of an IC that is formed on an IC package using a quad-flat no-lead (QFN) package scheme. FIG. 6 is a graph illustrating an example of an inductance based on a structure of FIG. 5. FIG. 7 is a graph illustrating a Q of an inductor that is obtained based on the inductance of FIG. 6. In the graph of FIG. 6, an x axis denotes a frequency and a y axis denotes an inductance L. In addition, in the graph of FIG. 7, an x axis denotes a frequency and a y axis denotes a Q.

Referring to the examples illustrated in FIGS. 6 and 7, when an inductor for an IC is formed on an IC package using a QFN scheme and the frequency is 2.4 GHz, the inductor has an inductance L of 7.4 nH and a Q value of 116.

Figure 8:
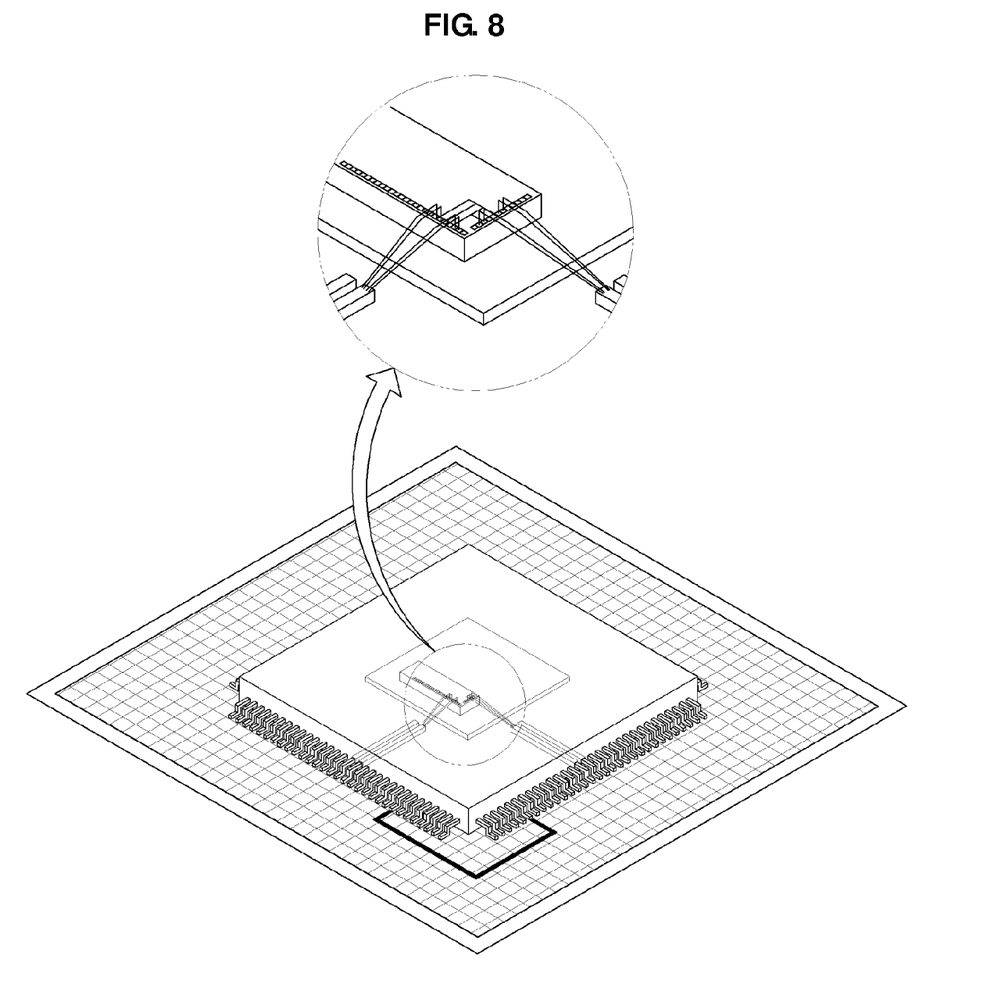
FIG. 8 is a diagram illustrating an example of an inductor of an IC that is formed on an IC package using an exposed thin quad flat package (ETQFP) scheme.
Figure 9:
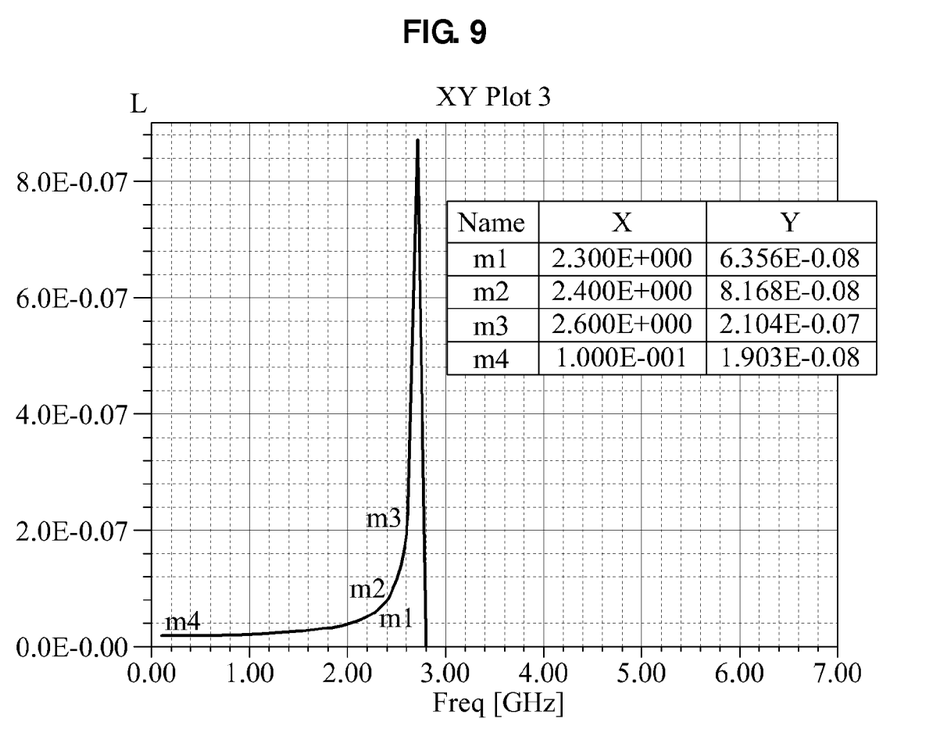
FIG. 9 is a graph illustrating an example of an inductance based on a structure of FIG. 8.
Figure 10:
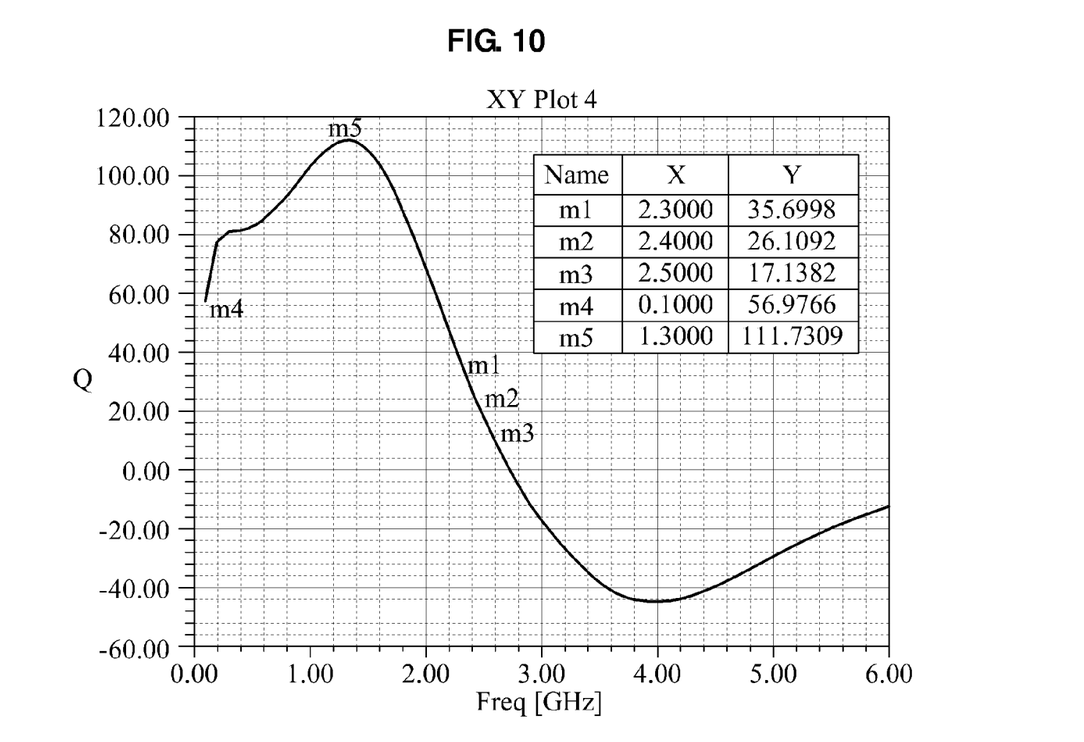
FIG. 10 is a graph illustrating a Q of an inductor that is obtained based on the inductance of FIG. 9.

FIG. 8 is a diagram illustrating an example of an inductor of an IC that is formed on an IC package using an exposed thin quad flat package (ETQFP) scheme. FIG. 9 is a graph illustrating an example of an inductance based on a structure of FIG. 8. FIG. 10 is a graph illustrating a Q of an inductor that is obtained based on the inductance of FIG. 9. In the graph of FIG. 9, an x axis denotes a frequency and a y axis denotes an inductance L. In addition, in the graph of FIG. 10, an x axis denotes a frequency and a y axis denotes a Q.

Referring to the examples illustrated in FIGS. 9 and 10, when an inductor for an IC is formed on an IC package using an ETQFP scheme and the frequency is 2.8 GHz, the inductor has an inductance L of 19 nH, a Q of 26, and a quality factor $Q_E$ with a high value of 100 or greater.

Q is defined based on a y parameter as one expression of a quality factor that has been used so far. The defined Q may indicate zero in a resonant frequency, and an actual Q value may have a peak value in a resonant frequency. The value of zero indicates that energy of an inductor is equal to energy of a capacitor.

Accordingly, the above Q enables a very accurate Q value to be easily and quickly known in a ½ frequency or less of the resonant frequency, which is, for example, a frequency in which capacitor energy is significantly small. Total energy based $Q_E$ indicates an actual Q and, thus, may show that the actual Q has a peak value in the resonant frequency. It can be known when performing physical based modeling of the inductor. Accordingly, since the actual Q has a peak value in the resonant frequency of 2.8 GHz, y parameter based Q is far greater than 100 around 1.4 GHz and, thus, may be further above 100 in 2.4 GHz.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An inductor, comprising:
a semiconductor substrate; and
a board trace comprising two sets of connections between the board trace and the semiconductor substrate, each of the two sets of connections comprising:
first and second bonding pads on the semiconductor substrate;
lead pins on the board trace;
a set of first bonding wires connecting the first bonding pad and a first lead pin of the lead pins; and
a set of second bonding wires connecting the second bonding pad and a second lead pin of the lead pins,
wherein the two sets of connections, the board trace, and the semiconductor substrate are included within an electrically closed loop,
wherein the lead pins, comprised in the each of the two sets of connections, are positioned to be in parallel, and
wherein the set of first bonding wires and the set of second bonding wires have a vertical structure.

2. The inductor of claim 1, wherein the first bonding wire, the second bonding wire, the lead pins, and the board trace are included within the electrically closed loop thereby causing an increase in a flux linkage that passes the closed loop.

3. The inductor of claim 1, further comprising:
an arm comprised of the first bonding wire and the second bonding wire and having a non-horizontal structure to reduce a flux coupling formed between the arm and another arm of the inductor.

4. The inductor of claim 1, wherein an inductance of the inductor is determined based on a combination of inductances of a length of the first bonding wire, a length of the second bonding wire, a length of the lead pin, and a length of the board trace.

5. The inductor of claim 1, wherein the first and second bonding pads overlap each other or are connected to each other.

6. The inductor of claim 1, wherein the first and second bonding pads are in parallel with each other, in series, or in a zigzagged form.

7. The inductor of claim 1, wherein the board trace comprises a single portion or a shredded parallel structure that is divided into at least two portions.

8. The inductor of claim 1, wherein the first and second bonding wires have different heights.

9. An inductor, comprising:
a semiconductor substrate; and
a board trace comprising two sets of connections between the board trace and the semiconductor substrate, each of the two sets of connections comprising:

bonding pads disposed on the semiconductor substrate, the bonding pads comprising a first bonding pad and a second bonding pad;

lead pins disposed on the board trace; and bonding wires connecting the bonding pads and the lead pins, the bonding wires comprising a set of first bonding wires and a set of second bonding wires, the set of first bonding wires connecting the first bonding pad and a first lead pin of the lead pins, the set of second bonding wires connecting the second bonding pad and a second lead pin of the lead pins, wherein the two sets of connections, the board trace, and the semiconductor substrate are included within an electrically closed loop, wherein the lead pins, comprised in the each of the two sets of connections, are positioned to be in parallel, and wherein the set of first bonding wires and the set of second bonding wires have a vertical structure.

10. The inductor of claim 9, wherein the bonding wires, the lead pins, and the board trace are included within the electrically closed loop thereby causing an increase in a flux linkage that passes through the closed loop.

11. The inductor of claim 9, wherein arms configured by the bonding wires comprise a non-horizontal structure to reduce a flux coupling formed between the arms.

12. The inductor of claim 9, wherein an inductance is determined based on a combination of inductances formed by the bonding wires, the lead pins, and the board trace.

13. The inductor of claim 9, wherein the bonding pads overlap each other or are connected to each other on the semiconductor substrate.

14. The inductor of claim 9, wherein the bonding pads are in parallel with each other, in series, or in a zigzagged form on the semiconductor substrate.

15. The inductor of claim 9, wherein the board trace comprises a single portion.

16. The inductor of claim 9, wherein the board trace comprises a shredded parallel structure that is divided into at least two portions, and a first one of the lead pins and a second one of the lead pins spaced apart from the first lead pin are connected to each other through the board trace.

17. The inductor of claim 9, wherein the bonding wires connected to the lead pins have different heights.

18. An inductor comprising:

a semiconductor substrate comprising a first group of bonding pads disposed on a first side thereof and a second group of bonding pads disposed on a second side thereof;

a board trace comprising lead pins disposed on the board trace, a first arm electrically connecting the board trace to the first group of bonding pads via a set of first bonding wires, and a second arm electrically connecting the board trace to the second group of bonding pads via a set of second bonding wires, wherein the semiconductor substrate, the board trace, and the first and second arms are included within an electrically closed loop, wherein the lead pins, connecting the board trace to each of the first arm and the second arm, are positioned to be in parallel, and wherein the first arm and the second arm have a vertical structure.

19. The inductor of claim 1, wherein the set of first bonding wires and the set of second bonding wires are connected to the lead pins in a sequentially increasing or decreasing heights.

* * * * *